US011532742B2

(12) United States Patent
Tailor et al.

(10) Patent No.: US 11,532,742 B2
(45) Date of Patent: Dec. 20, 2022

(54) INTEGRATED CIRCUIT STRUCTURE WITH METAL GATE AND METAL FIELD PLATE HAVING COPLANAR UPPER SURFACES

(71) Applicant: GLOBALFOUNDRIES U.S. Inc., Santa Clara, CA (US)

(72) Inventors: Ketankumar Harishbhai Tailor, Dresden (DE); Peter Baars, Dresden (DE)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 0 days.

(21) Appl. No.: 17/206,195

(22) Filed: Mar. 19, 2021

(65) Prior Publication Data

US 2022/0302306 A1      Sep. 22, 2022

(51) Int. Cl.
*H01L 29/78*         (2006.01)
*H01L 29/40*         (2006.01)
*H01L 21/8238*       (2006.01)
*H01L 27/092*        (2006.01)
(Continued)

(52) U.S. Cl.
CPC .... *H01L 29/7823* (2013.01); *H01L 21/82385* (2013.01); *H01L 27/0922* (2013.01); *H01L 29/401* (2013.01); *H01L 29/402* (2013.01); *H01L 29/42368* (2013.01);
(Continued)

(58) Field of Classification Search
CPC ........... H01L 29/7823; H01L 21/82385; H01L 27/0922; H01L 29/401; H01L 29/42368; H01L 29/66492; H01L 29/66689; H01L 29/7835; H01L 29/66674–66734;
(Continued)

(56) References Cited

U.S. PATENT DOCUMENTS 7,405,443 B1    7/2008 Zuniga et al.
7,462,906 B2   12/2008 Lu et al.
(Continued)

FOREIGN PATENT DOCUMENTS

CN        111092123 A     5/2020

OTHER PUBLICATIONS

K. Mistry et al., "A 45nm Logic Technology with High-k+Metal Gate Transistors, Strained Silicon, 9 Cu Interconnect Layers, 193nm Dry Pattering, and 100% Pb-free Packaging", 2007 IEEE International Election Devices Meeting, Washington, DC, 2007, pp. 247-250.

(Continued)

*Primary Examiner* — Shahed Ahmed
(74) *Attorney, Agent, or Firm* — Anthony Canale; Hoffman Warnick LLC

(57) ABSTRACT

An integrated circuit (IC) structure and a field plate are disclosed. The IC structure and field plate may find advantageous application with, for example, extended drain metal-oxide semiconductor (EDMOS) transistors. The IC structure includes a transistor including a metal gate structure and a drain extension region extending laterally from partially under the metal gate structure to a drain region. A metal field plate is over the drain extension region. Due to being formed simultaneously as part of a gate-last formation approach, the metal field plate has an upper surface coplanar with an upper surface of the metal gate structure. A field plate contact may be on the metal field plate.

18 Claims, 9 Drawing Sheets

(51) Int. Cl.
*H01L 29/423* (2006.01)
*H01L 29/66* (2006.01)

(52) U.S. Cl.
CPC .. *H01L 29/66492* (2013.01); *H01L 29/66689* (2013.01); *H01L 29/7835* (2013.01)

(58) Field of Classification Search
CPC ... H01L 29/7801–7826; H01L 29/0856–0869; H01L 29/0873–0886; H01L 29/402–407
See application file for complete search history.

(56) References Cited

U.S. PATENT DOCUMENTS

| | | | |
|---|---|---|---|
| 8,541,848 B2 * | 9/2013 | Huang | H01L 29/0653 257/E29.256 |
| 8,790,966 B2 | 7/2014 | Zhang et al. | |
| 8,963,241 B1 | 2/2015 | Khemka et al. | |
| 9,184,252 B2 | 11/2015 | Chuang et al. | |
| 9,219,147 B2 | 12/2015 | Toh et al. | |
| 9,590,053 B2 | 3/2017 | Chou et al. | |
| 9,793,281 B2 | 10/2017 | Su et al. | |
| 9,871,132 B1 | 1/2018 | Liu et al. | |
| 9,905,687 B1 | 2/2018 | Zhu et al. | |
| 9,954,097 B2 | 4/2018 | Chou et al. | |
| 10,636,904 B2 | 4/2020 | Chou et al. | |
| 11,158,737 B2 | 10/2021 | Jin et al. | |
| 2019/0027585 A1 | 1/2019 | Wei et al. | |
| 2019/0221666 A1 | 7/2019 | Bang et al. | |
| 2019/0334032 A1 * | 10/2019 | Ho | H01L 29/66689 |
| 2019/0363186 A1 * | 11/2019 | You | H01L 29/66704 |
| 2020/0013888 A1 | 1/2020 | Su et al. | |
| 2020/0126990 A1 * | 4/2020 | Zhang | H01L 29/404 |
| 2021/0036112 A1 | 2/2021 | Xu | |
| 2021/0234042 A1 * | 7/2021 | Xu | H01L 29/7816 |

OTHER PUBLICATIONS

"Structure and Method to Provide Conductive Field Plate Over Gate Structure", U.S. Appl. No. 17/029,446, filed Sep. 23, 2020.

U.S. Appl. No. 17/029,446 Office Action dated Dec. 13, 2021, 15 pages.

U.S. Patent Application titled: "Transistor Structure with Gate Over Well Boundary and Related Methods to Form Same," filed Jan. 6, 2022, 48 pages.

U.S. Appl. No. 17/029,446, Final Office Action dated Apr. 5, 2022, 12 pages.

* cited by examiner

INTEGRATED CIRCUIT STRUCTURE WITH METAL GATE AND METAL FIELD PLATE HAVING COPLANAR UPPER SURFACES

BACKGROUND

The present disclosure relates to integrated circuits, and more specifically, to an integrated circuit structure including a metal gate structure and a metal field plate having coplanar upper surfaces. The structure may be advantageously employed, for example, in an extended drain metal-oxide semiconductor (EDMOS) transistor setting.

A goal of integrated circuit (IC) structure manufacturing is to minimize structure dimensions, thereby including more structures per chip as well as increasing chip reliability and performance. However, reducing dimensions may lead to undesirable outcomes. In advanced node planar field effect transistor (FET) structures, for instance, the proximity of gate contacts to other conductors may lead to unwanted parasitic capacitance or conduction, i.e., leakage, between these adjacent structures. This situation can adversely affect structure performance or yield. In another example, as structure dimensions decrease and the electric field in the channel region increases, high-energy particles travelling through the channel region, known as "hot carriers," may be injected into and cause damage to structures within the structure, such as gate dielectric layers. In another example, as structure dimensions decrease, the dimensions of protective layers also decrease. Decreasing the dimensions of protective layers increases, for example, the likelihood of unwanted short circuits between adjacent conductive elements.

High voltage (HV) IC structures for handling high voltage input/output ("I/O") signals are also desirable. In some applications such as mobile phones and other handheld devices, high voltage may be between, for example, 5 Volts (V) to 60 V, while in other applications, high voltage may be between 100 V to 1000 V. To allow use for high voltage, some HV IC structures may have an asymmetrical structure having a thick gate dielectric layer on the drain side of the transistor and over an extended drain. A voltage may be applied to a field plate over the extended drain to create an electric field in the extended drain and/or the gate dielectric layer at a drain edge. The field plate over the drain extension region improves breakdown voltage, ON-state performance, and hot carrier injection reliability of the high voltage device, compared to not having the field plate structure. The effect of the field plate structure varies with its dimensions and location over the drain extension region. The effect of the field plate structure is most prominent if the field plate is adjacent to a drain side gate spacer. Forming a field plate in this setting for an asymmetric HV IC structure can be challenging without creating the noted undesirable outcomes such as short circuits. Further, field plate formation with certain materials, e.g., metals, and within a gate-last formation approach, can be challenging.

SUMMARY

An aspect of the disclosure is directed to an integrated circuit (IC) structure, comprising: a transistor, including: a metal gate structure and a drain extension region extending laterally from partially under the metal gate structure to a drain region; and a metal field plate over the drain extension region, the metal field plate having an upper surface coplanar with an upper surface of the metal gate structure.

Another aspect of the disclosure includes a field plate for an extended drain metal-oxide semiconductor (EDMOS) transistor, the field plate comprising: a metal body adjacent a drain-side gate spacer of a metal gate structure of the EDMOS transistor, the metal body having an upper surface coplanar with an upper surface of the metal gate structure; and a silicide-blocking layer between the metal body and the drain-side gate spacer.

An aspect of the disclosure related to a method comprising: forming a transistor including: a metal gate structure, a drain extension region extending laterally from partially under the gate structure to a drain region, and a drain-side gate spacer located over the drain extension region; and forming a metal field plate over the drain extension region, the metal field plate having an upper surface coplanar with an upper surface of the metal gate structure.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
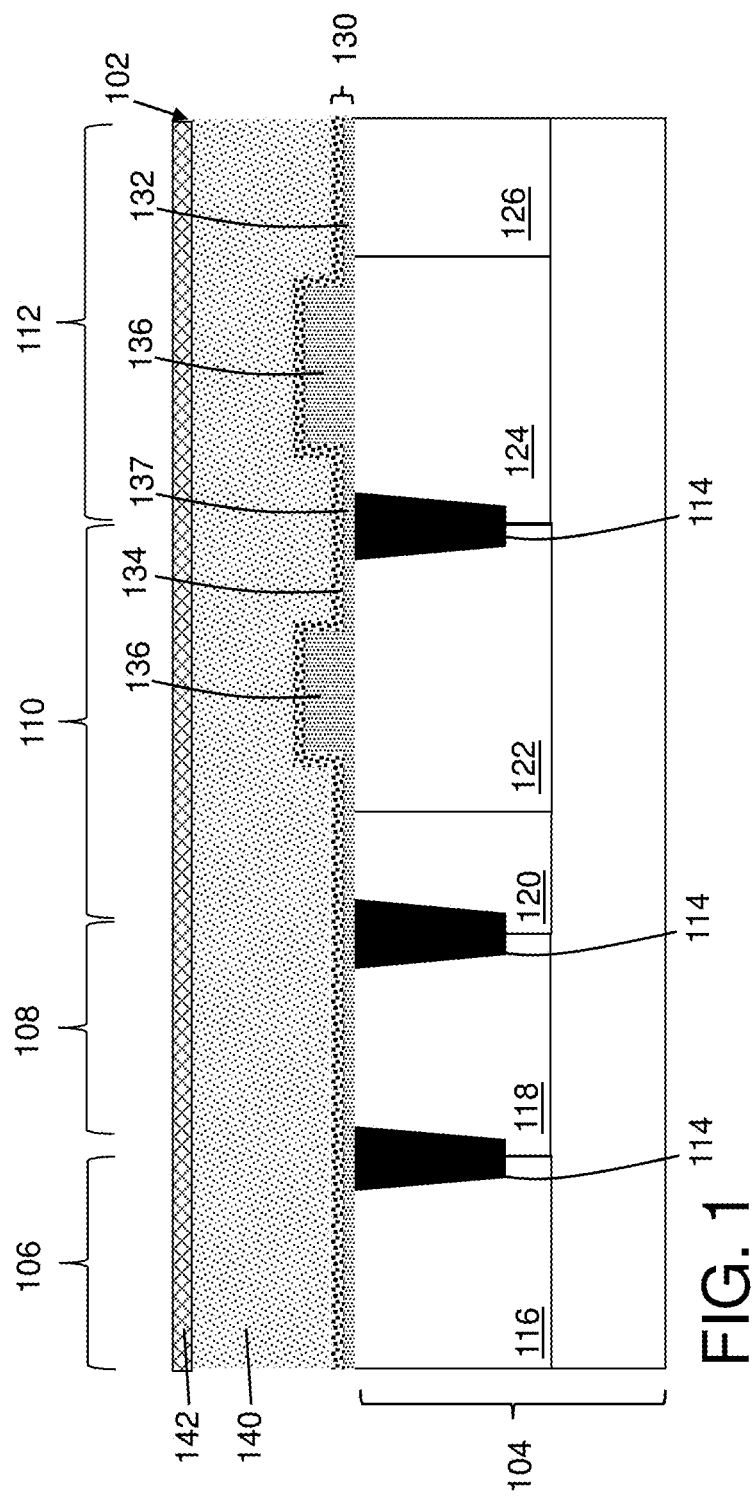
FIG. 1 shows a cross-sectional view of a preliminary structure for a method, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

An integrated circuit (IC) structure and a field plate are provided, which may find advantageous application with, among other things, extended drain metal-oxide semiconductor (EDMOS) transistors. The IC structure includes a transistor including a metal gate structure and a drain extension region extending laterally from partially under the metal gate structure to a drain region. A metal field plate may be over the drain extension region. The metal field plate may have an upper surface coplanar with an upper surface of the metal gate structure, e.g., due to being formed simultaneously as part of a gate-last formation approach. A field plate contact may be on the metal field plate. The metal field plate improves the device performance and hot carrier lifetime, i.e., by reducing hot carrier degradation. In some cases, and depending on designer requirements, a voltage may be applied to the metal field plate, e.g., ground, positive or negative voltage, to create a desired electric field in the drain extension and/or gate edge.

Figure 8:
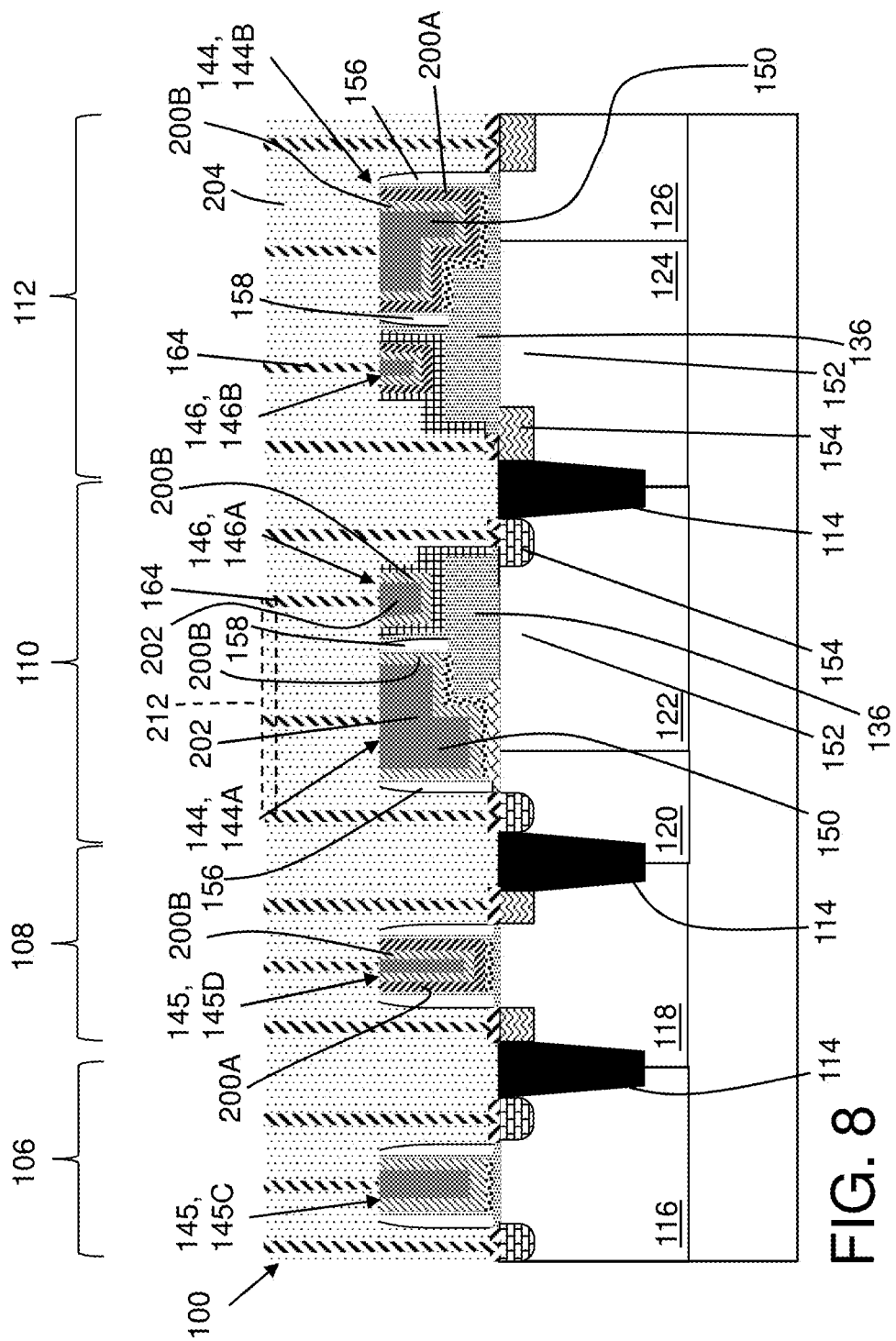
FIG. 8 shows a cross-sectional view of simultaneously forming a metal gate structure and a metal field plate of an IC structure, according to embodiments of the disclosure.
Figure 9:
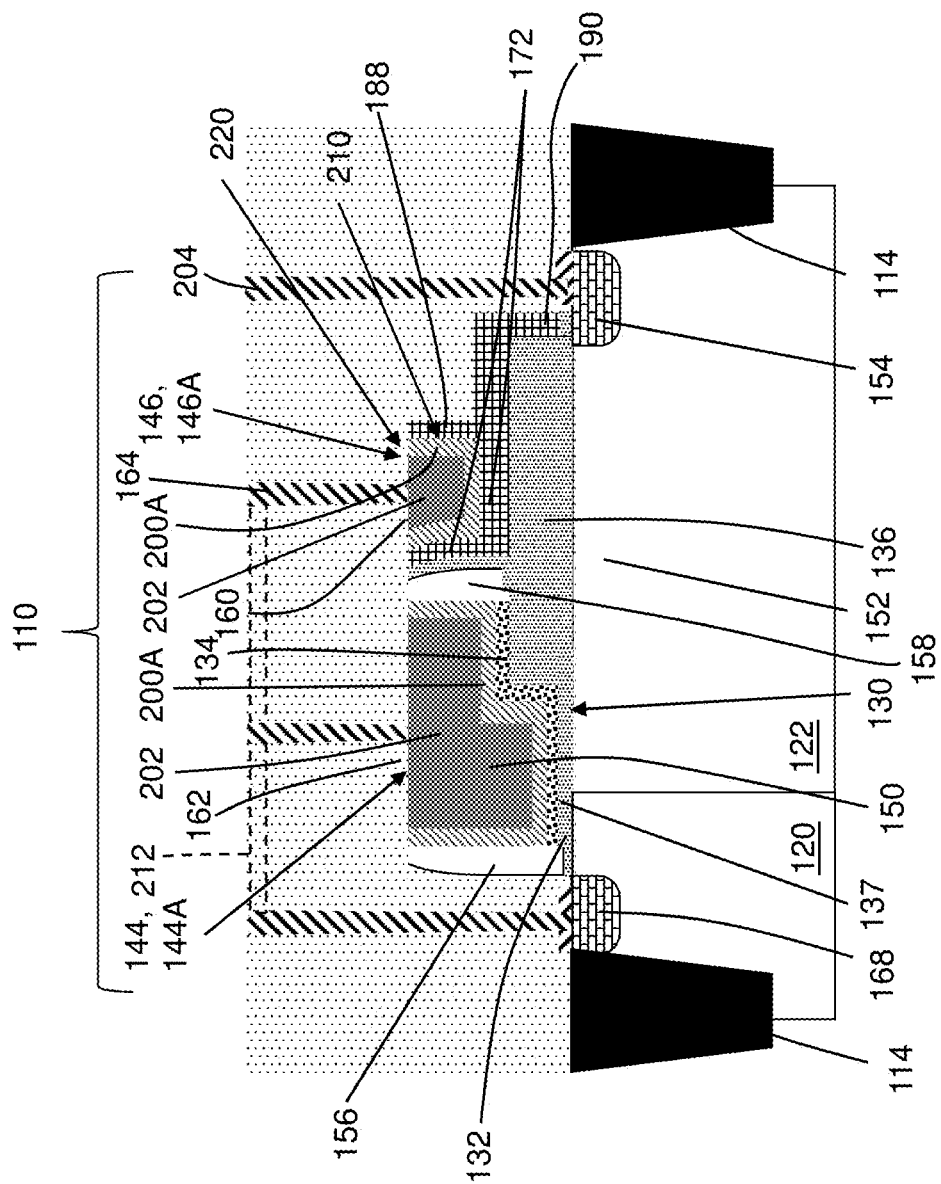
FIG. 9 shows an enlarged cross-sectional view of a transistor including a field plate with a metal body, according to embodiments of the disclosure.

Referring briefly to FIGS. 8 and 9, an IC structure 100 is shown. FIG. 8 shows a cross-sectional view of IC structure 100 including a high voltage (HV) EDMOS transistor(s) 144 with a metal field plate 146. FIG. 9 shows an enlarged cross-sectional view of an illustrative HV EDMOS transistor 144A in region 110 from FIG. 8. As shown in FIG. 8, in addition to forming HV EDMOS transistor(s) 144, embodiments of the disclosure are also compatible with other types of transistors such as low voltage metal-oxide semiconductor (LV MOS) transistors 145, e.g., logic devices.

Figure 2:
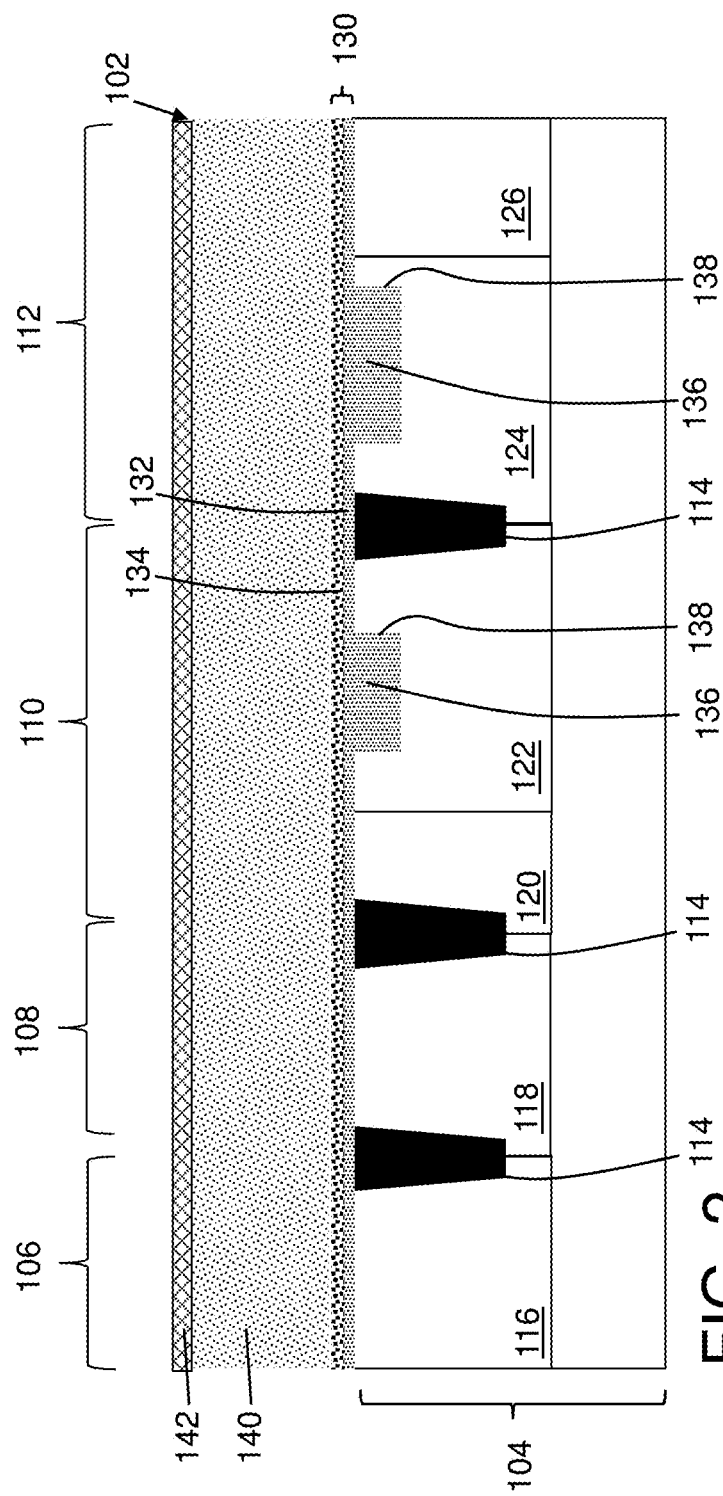
FIG. 2 shows a cross-sectional view of a preliminary structure for a method, according to alternative embodiments of the disclosure.

FIGS. 1 and 2 show a preliminary structure 102 from which IC structure 100 (FIG. 8) can be formed. Preliminary structure 102 includes a semiconductor substrate 104. Semiconductor substrate 104 may include but is not limited to silicon, germanium, silicon germanium, silicon carbide, or any other common IC semiconductor substrates. A portion or entire semiconductor substrate 104 may be strained.

For purposes of reference, four regions 106, 108, 110, 112 for different types of transistors will be illustrated. Each region may be electrically isolated by trench isolations 114 (three shown). Each trench isolation 114 may include a trench etched into semiconductor substrate 104 and filled with an insulating material such as oxide, to isolate one region of the substrate from an adjacent region of the substrate. One or more transistors of a given polarity may be disposed within each region 106, 108, 110, 112 and isolated from others by trench isolations 114. Semiconductor substrate 104 may include a variety of doped wells therein for formation of different polarity transistors. Region 106 includes, for example, a p-well 116 in semiconductor substrate 104 for providing an n-type LV MOS transistor 144C (FIG. 8). Region 108 includes, for example, an n-well 118 in semiconductor substrate 104 for a p-type LV MOS transistor 144D (FIG. 8). Region 110 includes, for example, a p-well 120 adjacent an n-well 122 in semiconductor substrate 104 for an n-type HV EDMOS transistor 144A (FIGS. 8 and 9). Region 112 includes, for example, a p-well 124 adjacent an n-well 126 in semiconductor substrate 104 for a p-type HV EDMOS transistor 144B (FIG. 8). Each well may be formed using any appropriate n-type or p-type dopant, and may be formed using any now known or later developed technique, e.g., in-situ doping or ion implantation.

Preliminary structure 102 also includes a gate dielectric layer 130. Gate dielectric layer 130 may be formed in number of steps. For example, gate dielectric layer 130 formation may include depositing any now known or later developed high dielectric constant (high-K) gate dielectric layer 132, and patterning it to form a thicker region 136 and a thinner region 137 for HV EDMOS transistors 144 (FIG. 8). Thicker region 136 is removed where not necessary, e.g., for LV MOS transistor(s) 145 (FIG. 8). Thicker region 136 may be formed in any now known or later developed fashion. For example, thicker region 136 can be formed by local oxidation of silicon (LOCOS) processes and variants thereof, or it could also be formed as part of a shallow trench isolation or field oxide. In any event, drain extension region 152 (FIG. 3) may be below both thin and thicker gate dielectric layer 130 regions, i.e., from channel to drain contact. In FIG. 1, thicker region 136 may be above an upper surface of semiconductor substrate 104 and extends above the rest of high-K gate dielectric layer 132. Here, thicker region 136 may be formed by, for example, depositing a thick high-K gate dielectric layer 132, and then etching to thin it, leaving thicker region 136. (Gate dielectric layer 130 formation may also include depositing a low-K gate dielectric layer (not shown), and patterning it for devices such as input/output devices (not shown) for IC structure 100 (FIG. 8)). Gate dielectric layer 130 formation may also include depositing a high-K gate dielectric layer 134 over high-K gate dielectric layer 132. Each high-K gate dielectric layer 132, 134 may include any now known or later developed high-K material (K>3.9) typically used for gate dielectrics such as but not limited to metal oxides such as: tantalum oxide ($Ta_2O_5$), barium titanium oxide ($BaTiO_3$), hafnium oxide ($HfO_2$), zirconium oxide ($ZrO_2$), aluminum oxide ($Al_2O_3$), or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity), or a combination of these materials. The low-K gate dielectric layer (not shown) may include any now known or later developed low-K material (K<3.9) typically used for gate dielectrics such as but not limited to: silicon oxide ($SiO_2$), silicon nitride ($Si_3N_4$), silicon oxynitride (SiON) or any combination of these materials.

In view of the foregoing, in regions 110, 112 for HV EDMOS transistors 144 (FIG. 8), gate dielectric layer 130 may include thicker region 136 and thinner region 137 of high-K dielectric layer 132, while other regions 106, 108 for LV MOS transistors 145 (FIG. 8) only include a thin layer of high-K dielectric layer 132. While not shown for clarity, it is also recognized that in other embodiments, the bottom part of thinner region 137 and thicker region 136 of gate dielectric layer 130 may be a low-K dielectric layer (e.g., silicon oxide) and only the top portion of both thinner and thicker regions may include a high-K dielectric material.

As used herein, "depositing" may include any now known or later developed techniques appropriate for the material to be deposited including but are not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Gate dielectric layer 130 may be deposited, for example, using ALD.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases, which approach the wafer approximately from one direction, and therefore this process is highly anisotropic. Reactive-ion etching (RIE) operates under conditions intermediate between sputter and plasma etching and may be used to produce deep, narrow features, such as STI trenches. Here, thicker region 136 may be etched using a RIE.

Referring to FIG. 2, in another embodiment, gate dielectric layer 130 formation may include forming thicker region 136 of high-K gate dielectric layer 132 in a trench 138 in semiconductor substrate 104. Here, trench 138 may be formed in semiconductor substrate 104, e.g., using photolithography and etching, and then high-K gate dielectric layer 132 may be deposited (e.g., using ALD) into trench 138 and over semiconductor substrate 104. In lithography (or "photolithography"), a radiation sensitive "resist" coating is generally formed over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. Developer solution can remove the more soluble areas of the resist leaving a patterned resist. The patterned resist can then serve as a mask for the underlying layers which can then be selectively treated, such as to receive dopants and/or to undergo etching, for example.

Continuing with FIGS. 1-2, preliminary structure 102 may also include a material layer 140 with a silicon nitride ($Si_3N_4$) cap 142 thereover. Material layer 140 may include any now known or later developed material for replacement metal gate (RMG) processing, also known as gate-last processing, such as amorphous silicon or polysilicon. Material layer 140 may be deposited, e.g., using ALD, and then planarized, e.g., using chemical mechanical polishing (CMP). Nitride cap 142 may be deposited over layer 140, e.g., using ALD, for use as an etch stop layer during subsequent processing.

For purposes of further description, the rest of the method will be described exclusively with the FIG. 1 embodiment of gate dielectric layer 130, i.e., with thicker region 136 above the upper surface of semiconductor substrate 104. It will be readily recognized that the teachings of the disclosure are applicable to the FIG. 2 option also.

FIGS. 3-9 show cross-sectional views of forming a transistor 144 (FIGS. 8-9) and a metal field plate 146 (FIGS. 8-9). For purposes of understanding of the method of forming transistor 144 and metal field plate 146, a brief introduction to the structure while referring to FIGS. 8 and 9 is helpful. FIG. 8 shows two HV EDMOS transistors 144A-B and corresponding metal field plates 146A-B on the right side—in regions 110, 112. Structures in region 110 may be labeled with an "A," and those in region 112 may be labeled with a "B," for ease of reference. Similarly, structures in region 106 may be labeled with a "C," and those in region 108 may be labeled with a "D," for ease of reference. In FIG. 8, transistor 144A may be in region 110 and includes p-well 120 adjacent n-well 122 in semiconductor substrate 104 to form an n-type HV EDMOS transistor, and transistor 144B may be in region 112 and includes p-well 124 adjacent n-well 126 in semiconductor substrate 104 to form a p-type HV EDMOS transistor. As will be described, transistors 144A-B may each include a metal gate structure 150, a drain extension region 152 extending laterally from partially under metal gate structure 150 to a drain region 154. Each transistor 144A-B may also include a gate spacer 156 including a drain-side gate spacer 158 located over drain extension region 152. As also shown in FIG. 8, and as will be further described, because the RMG processing for HV EDMOS transistors 144A-B includes conventional RMG processing, the method may also include forming a plurality of LV MOS transistors 145C-D adjacent transistor(s) 144, while forming transistor(s) 144 and metal field plate(s) 146.

That is, logic LV MOS transistors 145C (n-type) in region 106 and LV MOS transistors 145D (p-type) in region 108 can be fabricated simultaneously with HV EDMOS transistors 144. As shown in FIG. 8, metal field plates 146A-B are over respective drain extension regions 152, i.e., of transistors 144A-B. Formation of metal gate structure 150 and metal field plate 146 occurs simultaneously. As a result, and as shown best in FIG. 9, metal field plate 146 has an upper surface 160 coplanar with an upper surface 162 of metal gate structure 150. The method may also include forming a field plate contact 164 on metal field plate(s) 146.

Referring to FIGS. 3-9 for the specifics of the method of forming transistor(s) 144A-B and metal field plate 146, the process may include, as described previously, forming gate dielectric layer 130 over substrate 104. As described relative to FIGS. 1 and 2, thicker region 136 of gate dielectric layer 130 may be above or in substrate 104.

Figure 3:
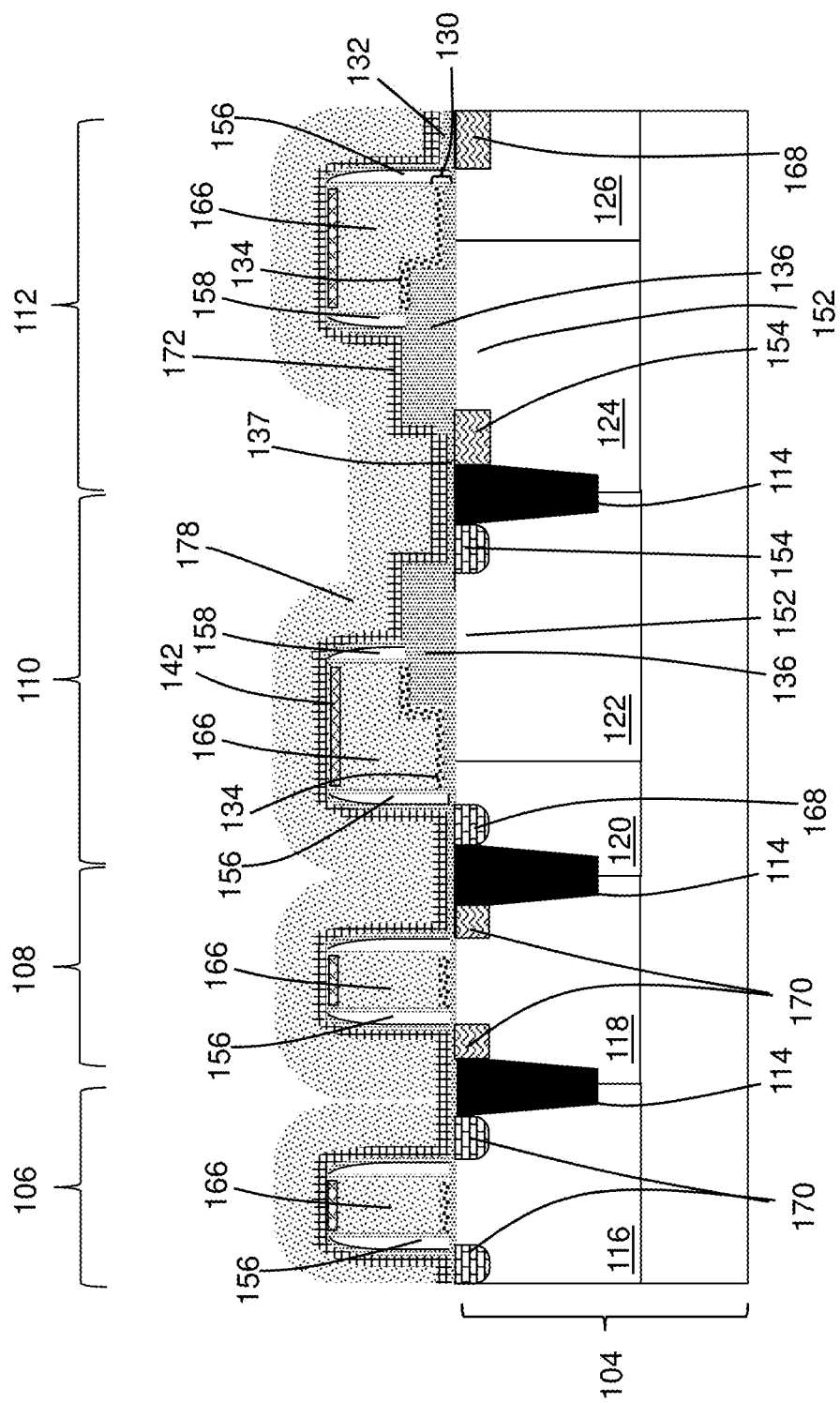
FIG. 3 shows a cross-sectional view of forming temporary gates, according to embodiments of the disclosure.

FIG. 3 shows a number of RMG steps including forming a temporary gate(s) 166 with drain-side gate spacer 158 over gate dielectric layer 130, e.g., thicker region 136 thereof. Temporary gate(s) 166 may be formed using any now known or later developed RMG process. For example, temporary gate(s) 166 may be patterned from material layer 140 (FIGS. 1-2) and nitride cap 142, using any technique. As illustrated, patterning of temporary gates 166 also patterns high-K gate dielectric layer 134 of gate dielectric layer 130. That is, the patterning removes layer 134 except under temporary gates 166. Temporary gates 166 extend partially over thicker region 136 of gate dielectric layer 130 in regions 110, 112 for HV EDMOS transistors 144 (FIG. 8). Gate spacer 156, including gate drain-side spacer 158, may be formed using any now known or later developed technique, e.g., deposition of layers of oxide and nitride, and then etching.

FIG. 3 also shows forming source/drain regions. For example, FIG. 3 shows forming a source region 168, drain region 154 and drain extension region 152 in substrate 104, of HV EDMOS transistor 144. As will be recognized, source/drain regions are doped with a dopant having a selected polarity for the desired transistor. An n-type transistor may include n-type dopants such as but not limited to: phosphorous (P), arsenic (As), antimony (Sb), and a p-type transistor may include p-type dopants such as but not limited to: boron (B), indium (In) and gallium (Ga). (Similar dopants, typically with different concentrations, may be used for doped wells 116, 118, 120, 122, 124, 126). Any necessary thermal process may be carried out to drive in the dopants. Source/drain regions 170 for LV MOS transistors 145 may also be formed at this time. It is understood that some of the processing for source/drain regions may be carried out prior to spacer 166 formation. Source/drain regions 154, 168, 170 may be formed using any now known or later developed technique, e.g., in-situ doping, ion implantation, etc. While not shown for clarity, source/drain regions 154, 168, 170 formation may include forming raised source/drain regions, e.g., by recessing substrate 104 and epitaxially growing raised regions, perhaps with in-situ doping. The dopants used may be any dopant appropriate for the transistor to be formed. Any necessary anneal to drive in dopants may be performed.

After source/drain region formation, as shown in FIG. 3, the method may include forming a first silicide-blocking layer 172 over substrate 104. Silicide-blocking layer 172 may include any appropriate material layer(s), e.g., an oxide liner and nitride layer, and may be formed by any appropriate deposition technique, e.g., ALD. Silicide-blocking layer 172 and nitride cap 142 are shown over temporary gates 166.

FIG. 3 also shows a first step of forming a temporary field plate 176 (FIG. 4) over drain extension region 152. Here, the method includes forming a material layer 178 over substrate 104. Material layer 178 may include any now known or later developed material for replacement metal gate (RMG) processing, such as those listed herein for material layer 140. Material layer 178 may be deposited using any appropriate technique for the material, e.g., ALD. Material layer 178 may be planarized (not shown) after deposition.

Figure 4:
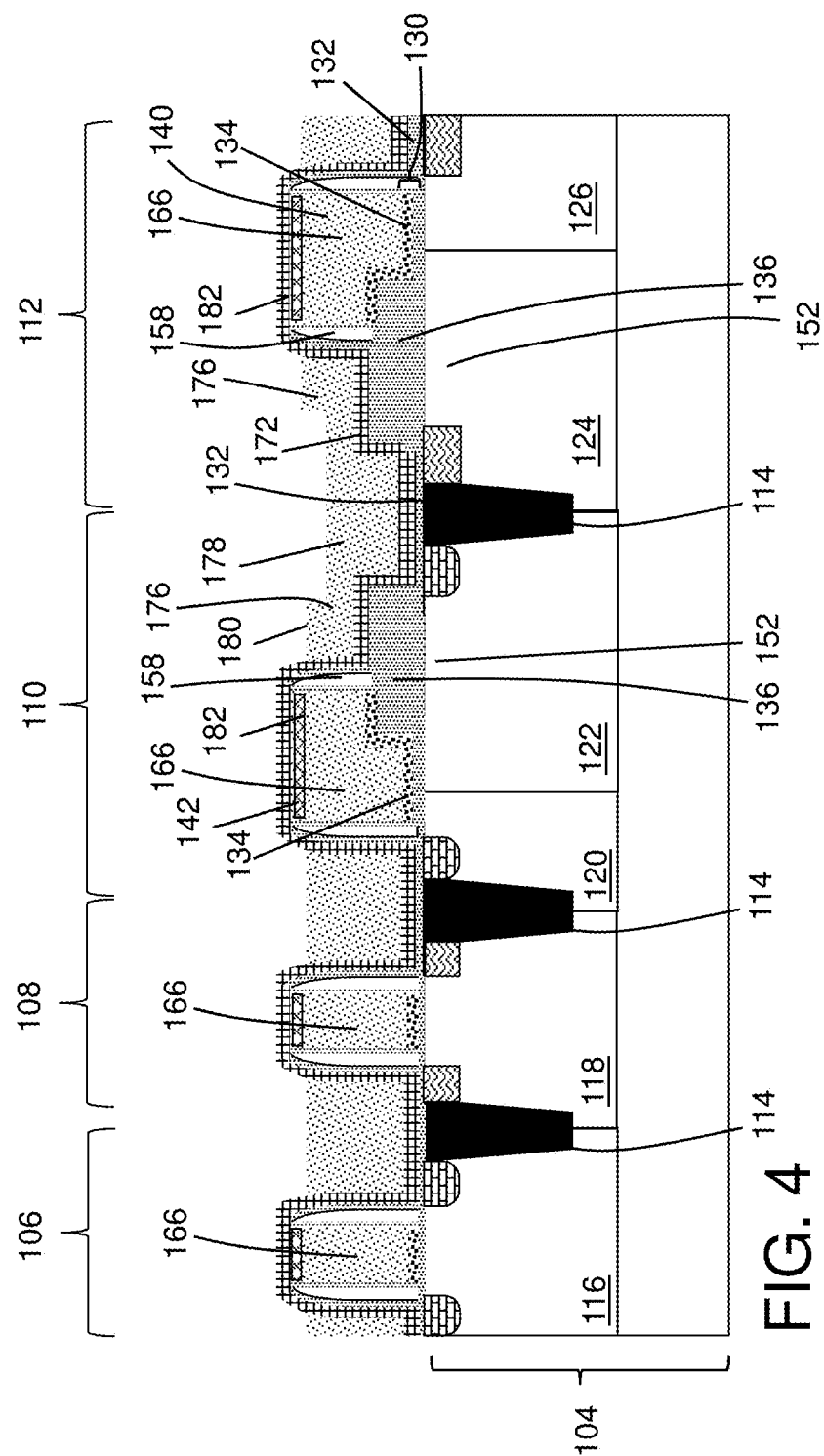
FIG. 4 shows a cross-sectional view of recessing a material layer for a temporary field plate, according to embodiments of the disclosure.
Figure 5:
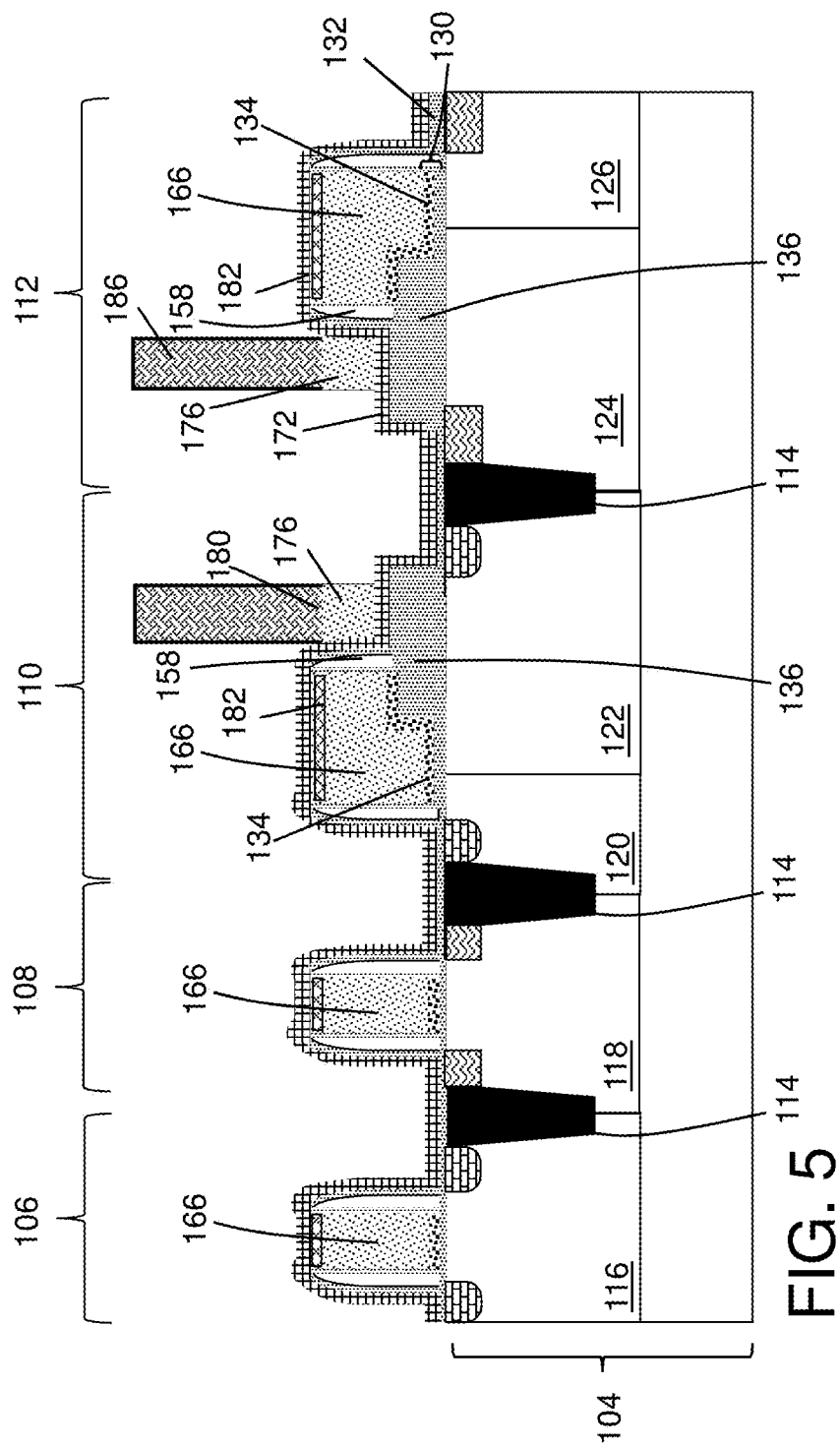
FIG. 5 shows a cross-sectional view of patterning a temporary field plate, according to embodiments of the disclosure.

FIGS. 4-5 show cross-sectional views of forming temporary field plate 176 from material layer 178. FIG. 4 shows recessing material layer 178 to have an upper surface 180 coplanar with an upper surface 182 of temporary gate(s) 166. Upper surface 182 of material layer 140 (FIGS. 1-2) may be under silicide-blocking layer 172 and nitride cap 142. The recessing may include any appropriate etching process, e.g., a RIE. As illustrated, temporary field plate(s) 176, which also may be referred to as spacers, are adjacent gate drain-side spacer(s) 158. FIG. 5 shows patterning temporary field plate 176. In this process, any appropriate mask 186 may be used to expose where temporary field plates 176 are not to exist, and an etching can be performed, e.g., a RIE, to remove material layer 178 (FIG. 4). Subsequently, mask 186 may be removed using any appropriate process, e.g., an ashing process.

Figure 6:
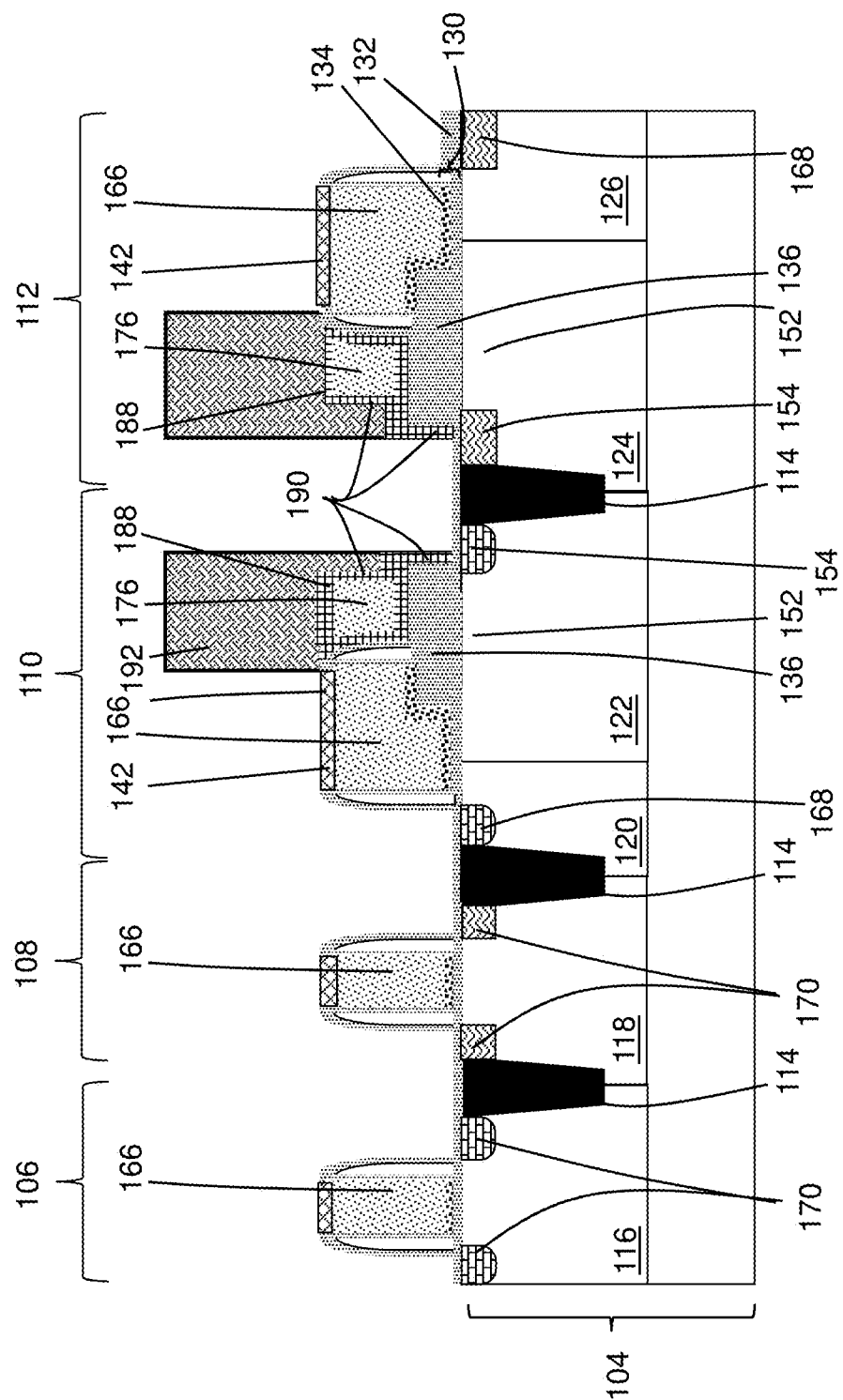
FIG. 6 shows a cross-sectional view of exposing source/drain regions, according to embodiments of the disclosure.

FIG. 6 shows a cross-sectional view of forming a silicide-blocking layer 188 over temporary field plate 176 to prevent silicidation thereon in later processing. Silicide-blocking layer 188 may be formed using any appropriate technique. Silicide-blocking layer 188 may include any appropriate material layer(s) as noted for layer 172, e.g., an oxide liner and nitride layer. Silicide-blocking layer 188 may be the same as or different material than silicide-blocking layer 172. Silicide-blocking layer 188 may be formed by any appropriate deposition technique. FIG. 6 also shows removing silicide-blocking layers 172 (FIG. 5) and 188 from any location where silicidation is required. As shown, silicide-blocking layers 172, 188 are removed from everywhere, except over part of temporary gate 166, drain extension region 152 and temporary field plate 176. Nitride cap 142 survives this removal process. This process creates a spacer 190 adjacent temporary field plate 176 and perhaps adjacent gate dielectric layer 130, i.e., thicker region 136. Spacer 190 prevents silicidation of temporary field plate 176 in subsequent processing. As shown in FIG. 8, short-circuiting of later formed contacts to, among other things, drain region 154 and/or metal field plate 146, may be prevented by remaining portions of silicide-blocking layers 172, 188 and thicker region 136 of gate dielectric layer 130. Silicide-blocking layers 172, 188 may be removed using any appropriate mask 192 to expose where the layer is to be removed. Any appropriate etching may be performed, e.g., a wet etch, to remove the layer. Silicide-blocking layers 172, 188 may also be removed in this step from any other desired source/drain regions 168, 170 for other devices such as LV MOS transistors 145. Subsequently, mask 192 may be removed using any appropriate process, e.g., an ashing process. Although not shown for clarity, an etch stop layer (e.g., silicon nitride) may be formed over the structure shown.

Figure 7:
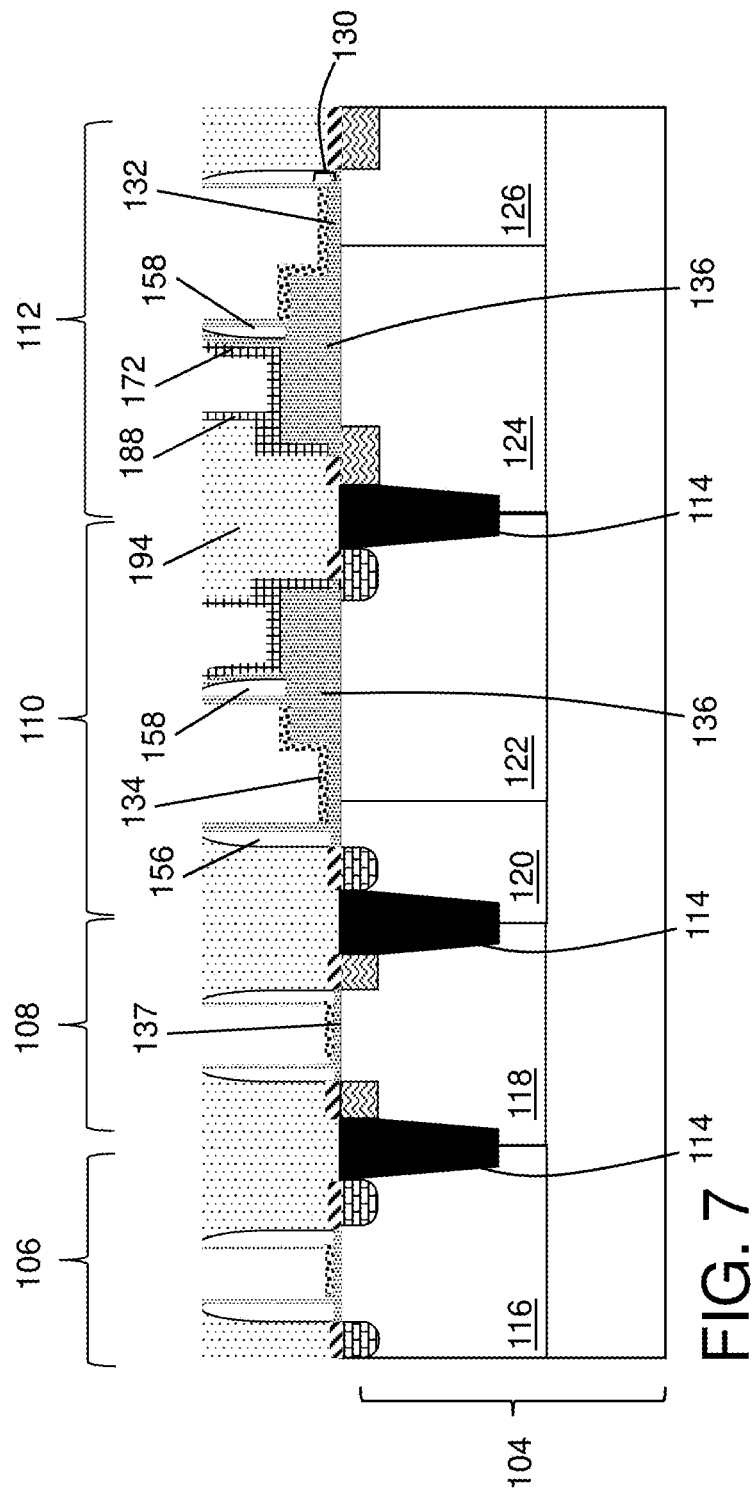
FIG. 7 shows a cross-sectional view of removing temporary gates and temporary field plates, according to embodiments of the disclosure.

FIG. 7 shows a cross-sectional view of a number of steps. FIG. 7 shows forming an inter-layer dielectric (ILD) 194 over substrate 104, and thus between temporary gates 166 (FIG. 6) and temporary field plates 176 (FIG. 6). In certain technology nodes, e.g., 28 nm or larger, silicidation of source/drain regions (shown in FIG. 7) may be performed prior to ILD 194 formation. In other technology nodes, e.g., 20 nm and beyond, it will be recognized that the silicidation may be performed through the contact forming openings, i.e., with formation of contacts—as shown in FIG. 8. ILD 194 may include any now known or later developed dielectric material appropriate for an ILD including, but not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. ILD 194 may be deposited using any appropriate deposition technique. Any excess material may be removed using any now known or later developed planarization process. Planarization refers to various processes that make a surface more planar (that is, more flat and/or smooth). Chemical-mechanical-polishing (CMP) is one currently conventional planarization process that planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a retaining ring. The dynamic polishing head is rotated with different axes of rotation (that is, not concentric). This process removes material and tends to even out any "topography," making the wafer flat and planar. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) etch-back.

FIGS. 7, 8 and 9 show simultaneously replacing temporary gate(s) 166 (FIG. 6) with metal gate structure(s) 150 and temporary field plate(s) 176 (FIG. 6) with metal field plate(s) 146. Silicide-blocking layer 172 (FIG. 6) and nitride cap 142 (FIG. 6) over temporary gates 166 (FIG. 6) and silicide-blocking layer 188 (FIG. 6) over temporary field plate 176 (FIG. 6) are also removed as part of this process. FIG. 7 shows removing temporary gate(s) 166 and temporary field plate(s) 176 in a process commonly referred to as a "poly pull." Temporary gate(s) 166 and temporary field plate(s) 176 may be removed using any now known or later developed RMG poly pull process, such as wet etch and/or RIE. The process removes the structures selective to ILD 194, i.e., it does not remove ILD 194, gate dielectric layer 130 (layers 132, 134, 136, 137), spacers 156, 158, or silicide-blocking layers 172, 180.

As shown in FIG. 8, the openings formed by the poly pull are then simultaneously filled with metal layers 200, 202 for metal gate structures 150 and for metal field plate 146. As will be described, metal layers 200, 202 for metal gate structure 150 and metal layers 200, 202 for metal field plate 146 are identical. Metal gate structures 150 and metal field plates 146 include one or more conductive components for providing conductive gate or field plate terminals. Metal gate structures 150 and metal field plate 146 may include a work function metal layer(s) 200 under a conductor layer 202. Work function metal (WFM) layer(s) 200 may include various metals depending on whether for an n-type or p-type device. The WFM layer may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. The appropriate WFM layer 200A may be deposited for a particular type transistor, e.g., p-type, then patterned and removed from the other type transistor, e.g., n-type. Then, a WFM layer 200B for the other type transistor, e.g., n-type, may be deposited, then patterned and etched to remove any additional material. Hence, IC structure 100 has n-type WFM layer 200B for NMOS regions 106, 110; or p-type WFM layer 200A and n-type WFM layer 200B for PMOS regions 108, 112. Conductor layer 202 may include any now known or later developed conductor for a metal gate, such as copper (Cu) or aluminum (Al). Conductor layer 202 may be deposited using any appropriate process, e.g., ALD. As can be observed, metal layers 200, 202 for metal gate structure 150 and metal layers 200, 202 for a corresponding metal field plate 146 are identical. Any planarization necessary to remove excess material may then be performed. As shown best in FIG. 9, due to the use of an RMG process to form metal field plate 146 simultaneously with metal gate structure 150, upper surface 160 of metal field plate 146 may be coplanar with upper surface 162 of metal gate structure 150. It is noted that, due to the planarization, drain-side spacer 158 also has an upper surface coplanar with upper surfaces 160, 162. Any necessary cap layers (not shown) of, for example, a nitride may also be formed after planarization. While a particular RMG process has been described, it will be recognized that the teachings of the disclosure are not limited to any particular RMG process. For example, one other RMG process, referred to as a 'dual poly removal' process, proceeds by removing only temporary gates for devices of one polarity, e.g., p-type, and then forms metal gate stacks (e.g., WFM and/conductor) for that polarity, and then removes temporary gates for devices of the other polarity, e.g., n-type, and then forms metal gate stacks for that polarity. Regardless of RMG process, metal field plate 146 may be formed simultaneously with a corresponding metal gate structure 150 such that their upper surfaces 160, 162 are coplanar.

As also shown in FIGS. 8 and 9, additional ILD layer(s) 204 may be formed, and any appropriate middle-of-line and back-end-of-line processing carried out to form contacts to metal gate structures 150, source/drain regions 154, 168, 170, and metal field plate 146. The method includes forming field plate contact 164 on metal field plate(s) 146. As the processes to form contacts are well known, no further details will be provided. Any necessary etch stop layers, e.g., single or dual contact etch stop layers, may be employed, and any silicidation can be carried out as known in the field as part of the processes.

FIG. 8 shows IC structure 100 including two HV EDMOS transistors 144A-B and metal field plates 146A-B on the right side—in regions 110, 112. In FIG. 8, transistor 144A may be in region 110 and includes p-well 120 adjacent n-well 122 in semiconductor substrate 104 to form an n-type HV EDMOS transistor, and transistor 144B may be in region 112 and includes p-well 124 adjacent n-well 126 in semiconductor substrate 104 to form a p-type HV EDMOS transistor. Each transistor 144A-B includes respective metal gate structures 150, and drain extension regions 152 extending laterally from partially under metal gate structures 150 to drain region 154. Transistors 144A-B may also each include gate spacer 156 including drain-side gate spacer 158 located over drain extension region 152. As shown in FIG. 8, IC structure 100 may also include plurality of logic transistors 145C-D adjacent transistor(s) 144, e.g., HV EDMOS transistors 144A-B. Logic LV MOS transistors 144C (n-type) in region 106 and LV MOS transistors 144D (p-type) in region 108 are fabricated simultaneously with HV EDMOS transistors 144A-B.

As shown in FIG. 8, metal field plates 146A-B are over respective drain extension regions 152, i.e., of transistors 144A-B. Again, as shown best in FIG. 9, metal field plate 146 has upper surface 160 coplanar with upper surface 162 of metal gate structures 150.

As noted, metal gate structure 150 and a corresponding metal field plate 146 include the same work function metal layer(s) 200 under the same conductor layer 202. As shown in FIG. 9, metal field plate 146 includes a metal body 210 including WFM layer(s) 200 (i.e., n-type WFM layer 200B for NMOS, or p-type WFM layer 200A and n-type WFM layer 200B for PMOS), and conductor layer 202. Metal gate structure 150 includes the same metal layers. Metal gate structure 150 further includes high-K gate dielectric layer 134 below work function metal layer 200. Metal field plate 146 may be adjacent to drain-side gate spacer 158 adjacent metal gate structure 150. IC structure 100 also includes silicide-blocking layer 172 between metal field plate 146 and drain-side gate spacer 158. Silicide-blocking layer 172 may be adjacent a sidewall of metal field plate 146, where it prevents silicidation of metal field plate 190 during the silicidation processing. Silicide-blocking layer 172 may be on a sidewall of gate dielectric layer 130, e.g., of thicker region 136, creating spacer 190. Silicide-blocking layer 172 may also be between metal field plate 146 and gate dielectric layer 130, i.e., thicker region 136 of high-K gate dielectric layer 132, under metal field plate 146.

Metal gate structure 150 extends over thinner region 137 and thicker region 136 of gate dielectric layer 130. Thicker region 136 of gate dielectric layer 130 may also be under metal field plate 146. Hence, gate dielectric layer 130 may be thicker under metal field plate 146 and over drain extension region 152 than under at least a portion of metal gate structure 150, which improves hot carrier injection reliability.

Metal field plate 146 may be used in a number of ways to improve performance. More particularly, metal field plate 146 may be coupled to other structures to create a desired electrical field or no electrical field (grounded) over drain extension region 152 and thicker region 136 of gate dielectric layer 130. For example, a metal wire 212 (shown in dashed line in FIGS. 8 and 9 in ILD 204 because it is buried into the page) may couple field plate contact 164 to source region 168 of a respective transistor 144 (as shown), drain region 154 of a respective transistor 144, a ground (0 Volts), or a biasing voltage (e.g., +/−1 Volts). Metal wire 212 does not contact the gate contact to metal gate structure 150.

Referring to FIG. 9, embodiments of the disclosure may also include a field plate 220 for, for example, an EDMOS transistor 144. Field plate 220 may also be applicable to other types of transistors. As described, field plate 220 may include metal body 210 (FIG. 9) adjacent drain-side gate spacer 158 of metal gate structure 150 of an adjacent transistor, e.g., EDMOS transistor 144. Metal body 210 has upper surface 160 coplanar with upper surface 162 of metal gate structure 150. Field plate 220 also includes silicide-blocking layer 172 between metal body 210 and drain-side gate spacer 158. Metal gate structure 150 and metal body 210 include WFM layer(s) 200 and conductor layer 202. Metal gate structure 150 may further include high-K dielectric layer 134 below work function metal layer 200. Silicide-blocking layer 172 may be adjacent a sidewall of gate dielectric layer 130, i.e., thicker region 136 thereof, providing spacer 190. Silicide-blocking layer 172 may be between metal body 210 and gate dielectric layer 130 under metal body 210. Gate dielectric layer 130 may be under metal gate structure 150 and metal body 210, and may be thicker under metal body 210 and over drain extension region 152 than under at least a portion of metal gate structure 150.

While FIG. 9 shows an n-type EDMOS transistor 144A in region 110, it will be recognized that the teachings of the disclosure are equally applicable to p-type EDMOS transistor 144B in region 112 (FIG. 8). In addition, while FIGS. 8-9 show one variation of gate dielectric layer 130 and thicker region 136, it should be noted that the two elements could vary in shape and size, which can impact the shape and size of field plate 220. For example, a length and/or thickness of gate dielectric layer 130 are typically design parameters that can vary from device to device.

IC structure 100 and field plate 220 provide improved performance for transistors, such as HV EDMOS devices. The metal field plate improves performance by, among other things, allowing applied voltages to create an electric field within the drain extension region and/or the gate dielectric layer at a drain edge to reduce hot carrier injection into the gate dielectric layer. Extended drain region 152 and thicker gate dielectric layer 130 allow high voltage use, e.g., operating gate voltage in the range of 2-5 V and operating drain voltage in the range of 5-60 V while also improving hot carrier reliability. The EDMOS transistors exhibit improved: breakdown voltage (Vbd) by, for example, 15-20%; saturation drain current (Idsat) by, for example, 5-7%; and hot carrier injection (HCI) by, for example, 20-40%. In addition, gate-to-drain capacitance (Cgd) can be reduced by, for example, 20%, compared to standard EDMOS devices without a field plate.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing structures as part of either (a) an intermediate product, such as a motherboard, or (b) an end product. The end product can be any product that includes integrated circuit chips, ranging from toys and other low-end applications to advanced computer products having a display, a keyboard or other input structure, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
   a transistor, including: a metal gate structure and a drain extension region extending laterally from partially under the metal gate structure to a drain region; and
   a metal field plate over the drain extension region, the metal field plate having an upper surface coplanar with an upper surface of the metal gate structure, wherein the metal gate structure and the metal field plate include a work function metal layer under a conductor layer that are identical.

2. The IC structure of claim 1, wherein the metal gate structure further includes a high dielectric constant gate dielectric layer below the work function metal layer.

3. The IC structure of claim 1, wherein the metal field plate is adjacent to a drain-side gate spacer adjacent the metal gate structure.

4. The IC structure of claim 1, further comprising a silicide-blocking layer between the metal field plate and a drain-side gate spacer.

5. The IC structure of claim 4, wherein the silicide-blocking layer is also adjacent a sidewall of a gate dielectric layer, and between the metal field plate and the gate dielectric layer under the metal field plate.

6. The IC structure of claim 1, further comprising a gate dielectric layer under the metal gate structure and the metal field plate, wherein the gate dielectric layer is thicker under the metal field plate and over the drain extension region than under at least a portion of the metal gate structure.

7. The IC structure of claim 1, further comprising a field plate contact on the metal field plate, and a metal wire coupling the field plate contact to one of a source region of the transistor, a drain region of the transistor, ground, and a biasing voltage.

8. A field plate for an extended drain metal-oxide semiconductor (EDMOS) transistor, the field plate comprising:
   a metal body adjacent a drain-side gate spacer of a metal gate structure of the EDMOS transistor, the metal body having an upper surface coplanar with an upper surface of the metal gate structure; and
   a silicide-blocking layer between the metal body and the drain-side gate spacer, wherein the metal gate structure and the metal body include a work function metal layer under a conductor layer that are identical.

9. The field plate of claim 8, wherein the metal gate structure further includes a high dielectric constant gate dielectric layer below the work function metal layer.

10. The field plate of claim 8, wherein the silicide-blocking layer is also adjacent a sidewall of a gate dielectric layer, and between the metal body and the gate dielectric layer under the metal body.

11. The field plate of claim 8, further comprising a gate dielectric layer under the metal gate structure and the metal body.

12. The field plate of claim 11, wherein the gate dielectric layer is thicker under the metal body and over a drain extension region than under at least a portion of the metal gate structure.

13. A method comprising:
   forming a transistor including: a metal gate structure, a drain extension region extending laterally from partially under the gate structure to a drain region, and a drain-side gate spacer located over the drain extension region; and
   forming a metal field plate over the drain extension region, the metal field plate having an upper surface coplanar with an upper surface of the metal gate structure wherein the metal gate structure and the metal field plate include a work function metal layer under a conductor layer that are identical.

14. The method of claim 13, wherein the metal gate structure forming and the metal field plate forming occur simultaneously.

15. The method of claim 13, wherein forming the transistor and the metal field plate include:
   forming a gate dielectric layer over a substrate;
   forming a first gate with the drain-side gate spacer over the gate dielectric layer;
   forming a source region, the drain region and the drain extension region in the substrate;
   forming a first silicide-blocking layer over the structure;
   forming a first field plate over the drain extension region;
   simultaneously replacing the first gate with metal layers for the metal gate structure and the first field plate with metal layers for the metal field plate.

16. The method of claim 15, wherein forming the gate dielectric layer further includes forming a high dielectric constant gate dielectric layer having a thicker region and a thinner region, wherein the first gate is over both the thinner region and the thicker region.

17. The method of claim 15, wherein forming the first field plate over the drain extension region includes:
   forming a material layer over the substrate;
   forming the first field plate from the material layer by recessing the material layer to have an upper surface coplanar with an upper surface of the first gate;
   forming a second silicide-blocking layer over the first field plate;

removing the first silicide-blocking layer from the drain region, creating a spacer adjacent the gate dielectric layer; and forming an inter-layer dielectric over the substrate.

18. The method of claim 13, further comprising forming a plurality of logic transistors adjacent the transistor while forming the transistor and the metal field plate.

* * * * *